US009859098B2

United States Patent
Holden et al.

(10) Patent No.: US 9,859,098 B2
(45) Date of Patent: Jan. 2, 2018

(54) TEMPERATURE CONTROLLED ION SOURCE

(71) Applicant: Varian Semiconductor Equipment Associates, Inc., Gloucester, MA (US)

(72) Inventors: Scott C. Holden, Melrose, MA (US); Bon-Woong Koo, Andover, MA (US); Brant S. Binns, Beverly, MA (US); Richard M. White, Newmarket, NH (US); Kenneth L. Starks, Gloucester, MA (US); Eric R. Cobb, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 75 days.

(21) Appl. No.: 14/977,720

(22) Filed: Dec. 22, 2015

(65) Prior Publication Data

US 2017/0178857 A1 Jun. 22, 2017

(51) Int. Cl.
*H01J 27/02* (2006.01)
*H01J 37/30* (2006.01)
*H01J 37/08* (2006.01)
*H01J 37/317* (2006.01)

(52) U.S. Cl.
CPC .......... *H01J 37/3002* (2013.01); *H01J 37/08* (2013.01); *H01J 37/3171* (2013.01); *H01J 2237/002* (2013.01)

(58) Field of Classification Search
CPC ...... H01J 27/02; H01J 27/022; H01J 37/3002; H01J 37/08; H01J 37/3171; H01J 2237/002
See application file for complete search history.

(56) References Cited

U.S. PATENT DOCUMENTS

| 8,183,542 | B2 | 5/2012 | Benveniste et al. |
| 8,188,448 | B2 | 5/2012 | Benveniste et al. |
| 2002/0159233 | A1 | 10/2002 | Patel et al. |
| 2005/0194098 | A1* | 9/2005 | Dillon ............... B22D 19/0072 156/345.37 |
| 2006/0060328 | A1 | 3/2006 | Ewes et al. |

(Continued)

FOREIGN PATENT DOCUMENTS

WO 2015/094381 A1 6/2016

OTHER PUBLICATIONS

International Search Report and Written Opinion dated Mar. 27, 2017 in corresponding PCT application No. PCT/US2016/064936.

*Primary Examiner* — David E Smith
(74) *Attorney, Agent, or Firm* — Nields, Lemack & Frame, LLC

(57) ABSTRACT

An ion source with improved temperature control is disclosed. A portion of the ion source is nestled within a recessed cavity in a heat sink, where the portion of the ion source and the recessed cavity are each shaped so that expansion of the ion source causes high pressure thermal contact with the heat sink. For example, the ion source may have a tapered cylindrical end, which fits within a recessed cavity in the heat sink. Thermal expansion of the ion source causes the tapered cylindrical end to press against the recessed cavity in the heat sink. By proper selection of the temperature of the heat sink, the temperature and flow of coolant fluid through the heat sink, and the size of the gap between the heat sink and the ion source, the temperature of the ion source can be controlled.

17 Claims, 7 Drawing Sheets

(56) References Cited

U.S. PATENT DOCUMENTS

| | | | | |
|---|---|---|---|---|
| 2007/0166599 A1* | 7/2007 | Burtner | ............... | H01J 27/022 |
| | | | | 250/423 R |
| 2008/0011451 A1* | 1/2008 | Wang | ............... | H01L 23/367 |
| | | | | 165/80.3 |
| 2008/0266808 A1* | 10/2008 | Aberg | ............... | H01L 23/4006 |
| | | | | 361/709 |
| 2011/0240877 A1* | 10/2011 | Benveniste | ............ | H01J 37/08 |
| | | | | 250/424 |
| 2011/0240878 A1* | 10/2011 | Benveniste | ............ | H01J 37/08 |
| | | | | 250/424 |
| 2012/0252195 A1* | 10/2012 | Jones | ............... | H01J 37/08 |
| | | | | 438/514 |
| 2013/0228708 A1 | 9/2013 | Coyle et al. | | |
| 2015/0084496 A1 | 3/2015 | Kaufman et al. | | |
| 2015/0090898 A1* | 4/2015 | Futter | ............... | H01J 3/04 |
| | | | | 250/423 R |
| 2015/0289850 A1* | 10/2015 | Lewis | ............... | A61B 8/546 |
| | | | | 600/459 |

\* cited by examiner

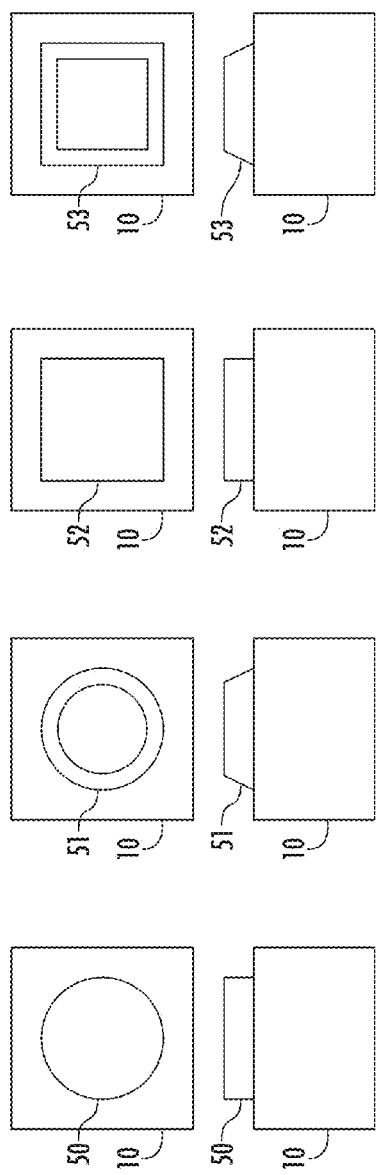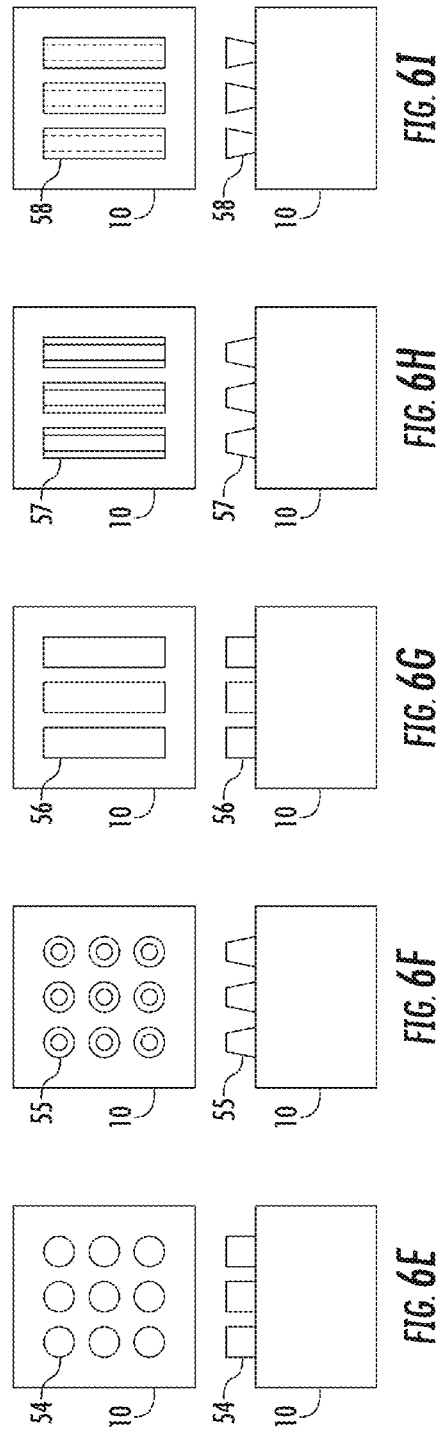

TEMPERATURE CONTROLLED ION SOURCE

FIELD

This disclosure relates to an ion source and, more particularly, an ion source where its temperature can be controlled and regulated by a heat sink.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

To create the ion beam, the ion source typically consumes large amounts of power. While much of this power is used to convert molecules into the desired ion species, a portion of this power is transformed into heat. In certain embodiments, the amount of heat may raise the temperature of the ion source hundreds or even thousands of degrees.

These extreme temperatures may have several disadvantages. For example, an ion source at these temperatures may have to be constructed using metals with very high melting points, which may increase their costs. Further, other components that are close to the ion source, such as the gas inlets, magnets, electrodes, and other components, also have to withstand these elevated temperatures. Additionally, these temperatures may have a detrimental effect on the operation or lifetime of the ion source.

Therefore, an ion beam where the temperature can be controlled and regulated would be advantageous. Further, it would be beneficial if the ion source could be maintained at a desired temperature or temperature range.

SUMMARY

An ion source with improved temperature control is disclosed. A portion of the ion source is nestled within a recessed cavity in a heat sink, where the portion of the ion source and the recessed cavity are each shaped so that expansion of the ion source causes high pressure thermal contact with the heat sink. For example, the ion source may have a tapered cylindrical end, which fits within a recessed cavity in the heat sink. Thermal expansion of the ion source causes the tapered cylindrical end to press against the recessed cavity in the heat sink. By proper selection of the temperature of the heat sink, the temperature and flow of coolant fluid through the heat sink, and the size of the gap between the heat sink and the ion source, the temperature of the ion source can be controlled.

According to one embodiment, an apparatus for generating an ion beam is disclosed. The apparatus comprises an ion source comprising a plurality of chamber walls, wherein an outward protrusion extends outward from one of the plurality of chamber walls, and a heat sink, having a recessed cavity, wherein the outward protrusion is disposed in the recessed cavity. In certain embodiments, at room temperature, there is an initial gap between the outward protrusion and the recessed cavity, and a temperature of the ion source is determined based on a temperature of the heat sink and the initial gap. In certain embodiments, the heat sink comprises channels and the temperature of the heat sink is determined based on a temperature of coolant fluid flowing through the channels. In certain embodiments, the temperature of the heat sink is determined based on a flow rate of coolant fluid flowing through the channels. In certain embodiments, the outward protrusion and the recessed cavity are complementary shapes. In some embodiments, the outward protrusion may be a cylinder, or a tapered cylinder.

In another embodiment, an apparatus for generating an ion beam is disclosed. The apparatus comprises an ion source comprising a plurality of chamber walls and an extraction aperture, and a heat sink; wherein thermal expansion of the ion source causes high pressure thermal contact with the heat sink, so as to regulate a temperature of the ion source. In certain embodiments, a portion of the ion source extended into a recessed cavity in the heat sink and thermal expansion causes the portion to contact sides of the recessed cavity.

In another embodiment, an apparatus for generating an ion beam is disclosed. The apparatus comprises an ion source comprising a plurality of chamber walls, wherein a tapered outward protrusion extends outward from one of the plurality of chamber walls, and a heat sink, having a recessed cavity, wherein the tapered outward protrusion is disposed in the recessed cavity; wherein, at room temperature, there is an initial gap between the tapered outward protrusion and the recessed cavity and wherein a temperature of the ion source is determined based on a temperature of the heat sink and the initial gap. In certain embodiments, the heat sink comprises channels and the temperature of the heat sink is determined based on the temperature of the coolant fluid flowing through the channels. In certain embodiments, the temperature of the heat sink is determined based on the flow rate of the coolant fluid flowing through the channels. In certain embodiments, the apparatus also comprises shims disposed between one of the chamber walls and the heat sink so as to set the initial gap.

BRIEF DESCRIPTION OF THE DRAWINGS

For a better understanding of the present disclosure, reference is made to the accompanying drawings, which are incorporated herein by reference and in which:

FIGS. 6A-6I show a variety of outward protrusions that may be employed with the apparatus of FIG. 1.

DETAILED DESCRIPTION

The embodiments are described herein in connection with an indirectly heated cathode (IHC) ion source. However, other ion sources, such as Bernas and Freeman ion sources or RF ion sources, may be used. Thus, the disclosure is not limited to the specific embodiments described below.

Figure 1:
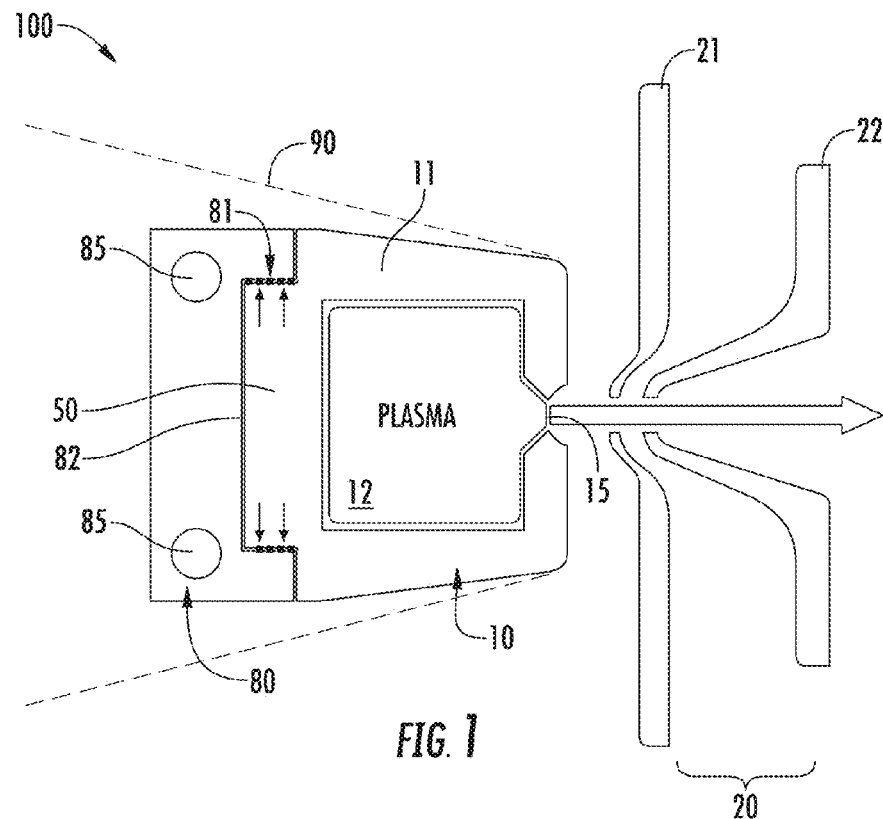
FIG. 1 shows a cross sectional view of an apparatus according to one embodiment.

FIG. 1 shows a representative apparatus 100 that may be used to generate an ion beam. The apparatus 100 includes an ion source 10 and a heat sink 80. The ion source 10 may be an indirectly heated cathode (IHC) ion source, although other ion sources may also be used. The ion source 10 has a plurality of chamber walls 11 defining an ion source chamber 12. The chamber walls 11 may be constructed of an electrically conductive material. One of the chamber walls has an extraction aperture 15, through which ions may be extracted from the ion source chamber 12. Outside the ion source chamber 12 and proximate the extraction aperture 15 are one or more electrodes 20. In certain embodiments, the electrodes 20 may include a suppression electrode 21 and a ground electrode 22, although other configurations of the electrodes 20 are also possible. These electrodes 20 may be in communication with one or more power supplies (not shown). For example, the suppression electrode 21 may be biased at a negative voltage to attract positive ions from the ion source chamber 12, while the ground electrode 22 may be grounded. Of course, the electrodes 20 may be biased at different voltages, if desired.

Figure 2A:
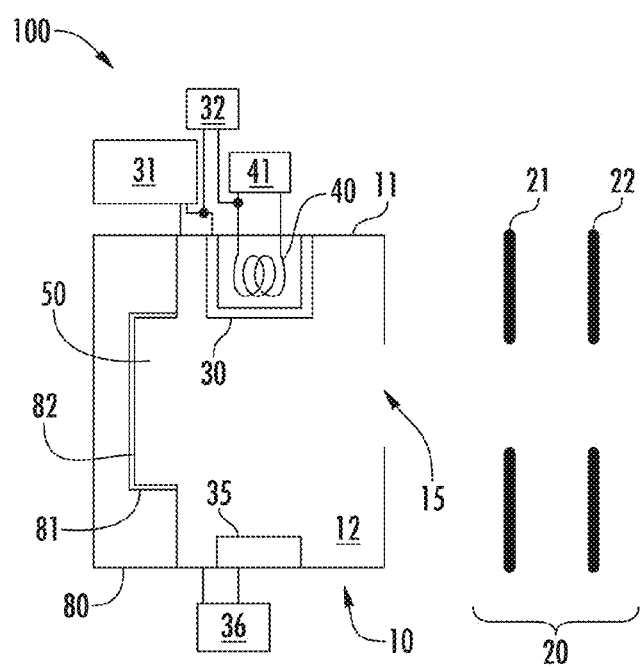
FIG. 2A shows a top cross sectional view of the apparatus of FIG. 1.
Figure 2B:
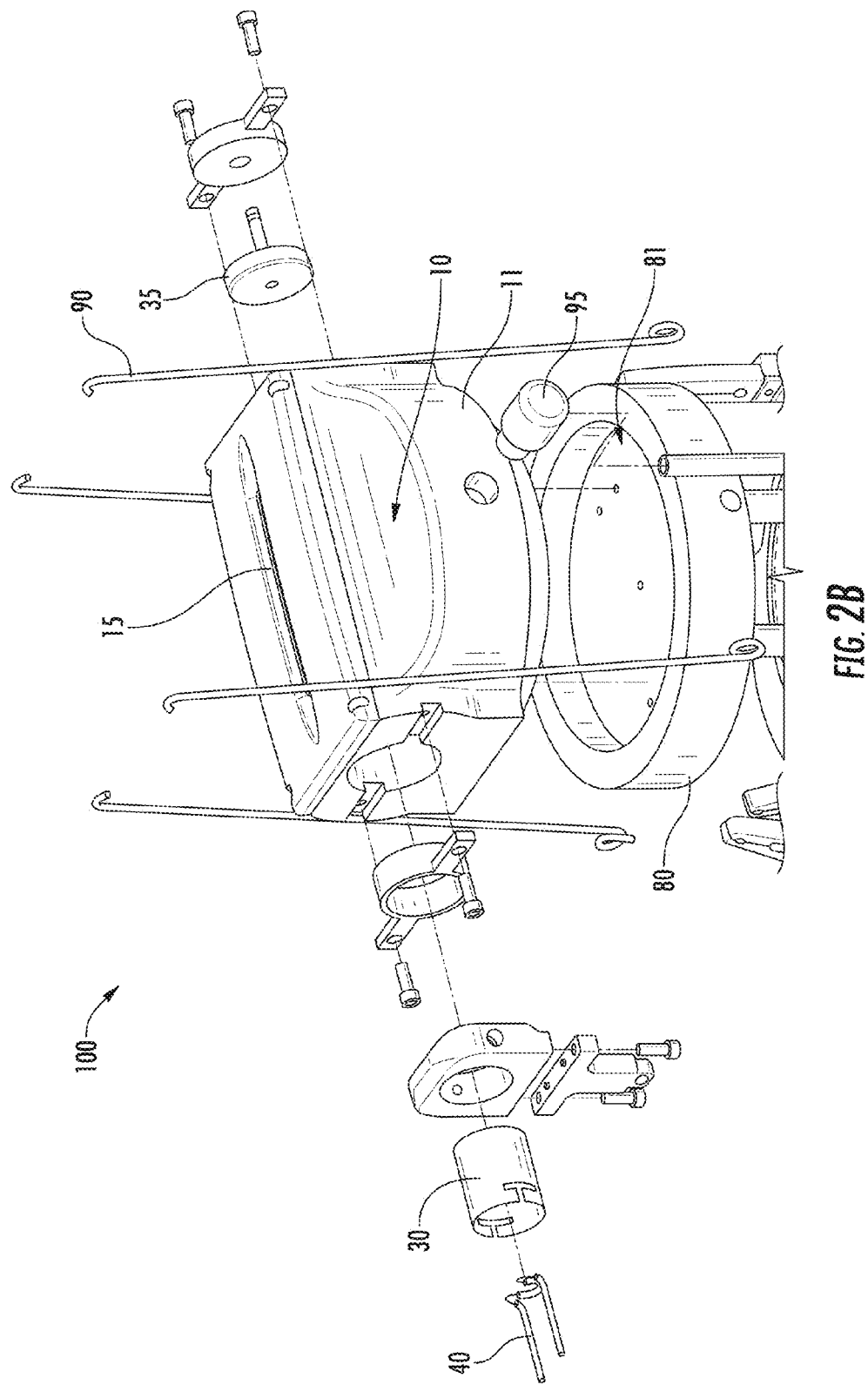
FIG. 2B shows an exploded view of the apparatus of FIG. 1.
Figure 2C:
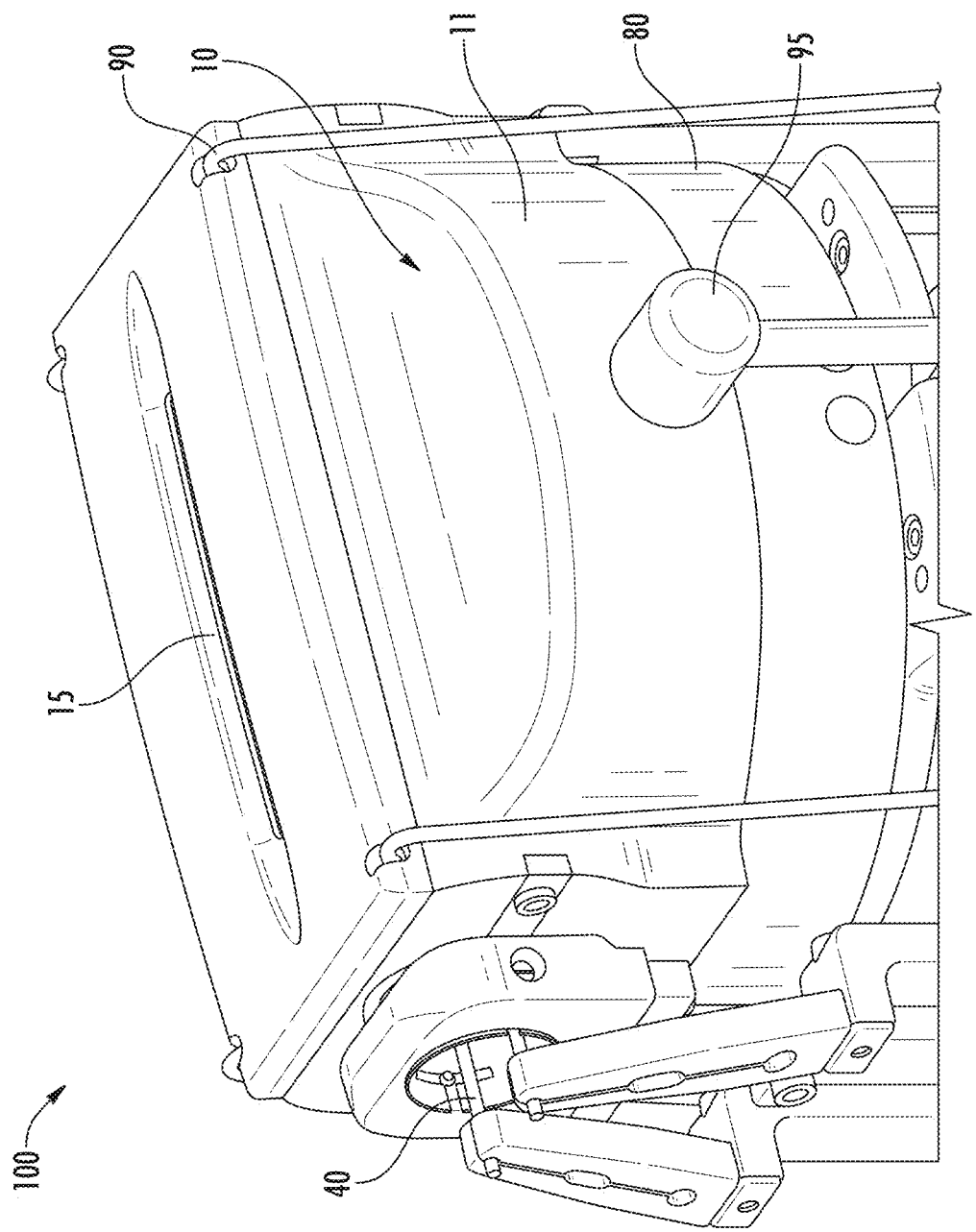
FIG. 2C shows an assembled view of the apparatus of FIG. 1.

As better seen in FIGS. 2A-2C, a cathode 30 is disposed in the ion source chamber 12. This cathode 30 is in communication with a cathode power supply 31, which serves to bias the cathode 30 with respect to the chamber walls 11. In certain embodiments, the cathode power supply may negatively bias the cathode 30 relative to the chamber walls 11. For example, the cathode power supply 31 may have an output in the range of 0 to −150V, although other voltages may be used. In certain embodiments, the cathode 30 is biased at between 0 and −40V relative to the chamber walls 11. A filament 40 is disposed behind the cathode 30.

The filament 40 is in communication with a filament power supply 41. The filament power supply 41 is configured to pass a current through the filament 40, such that the filament 40 emits thermionic electrons. Cathode bias power supply 32 biases filament 40 negatively relative to the cathode 30, so these thermionic electrons are accelerated from the filament 40 toward the cathode 30 and heat the cathode 30 when they strike the back surface of cathode 30. The cathode bias power supply 32 may bias the filament 40 so that it has a voltage that is between, for example, 300V to 600V more negative than the voltage of the cathode 30. The hot cathode 30 then emits thermionic electrons on its front surface into the ion source chamber 12.

Thus, the filament power supply 41 supplies a current to the filament 40. The cathode bias power supply 32 biases the filament 40 so that it is more negative than the cathode 30, so that electrons are attracted toward the cathode 30 from the filament 40. Finally, the cathode power supply 31 biases the cathode 30 more negatively than the chamber walls 11.

A repeller 35 is disposed in the ion source chamber 12 on an end of the ion source chamber 12 opposite the cathode 30. The repeller 35 may be in communication with repeller power supply 36. As the name suggests, the repeller 35 serves to repel the electrons emitted from the cathode 30 back toward the center of the ion source chamber 12. For example, the repeller 35 may be biased at a negative voltage relative to the chamber walls 11 to repel the electrons. Like the cathode power supply 31, the repeller power supply 36 may negatively bias the repeller 35 relative to the chamber walls 11. For example, the repeller power supply 36 may have an output in the range of 0 to −150V, although other voltages may be used. In certain embodiments, the repeller 35 is biased at between 0 and −40V relative to the chamber walls 11.

In certain embodiments, the cathode 30 and the repeller 35 may be connected to a common power supply. Thus, in this embodiment, the cathode power supply 31 and repeller power supply 36 are the same power supply.

Although not shown, in certain embodiments, a magnetic field is generated in the ion source chamber 12. This magnetic field is intended to confine the electrons along one direction. For example, electrons may be confined in a column that is parallel to the direction from the cathode 30 to the repeller 35.

In certain embodiments, one chamber wall 11, such as the chamber wall opposite the extraction aperture 15, may not be flat. Rather, a portion of that wall may extend outward from the ion source chamber 12 and form an outward protrusion 50. This outward protrusion 50 may interface with a corresponding recessed cavity 81 in the heat sink 80. While the figures show the outward protrusion 50 being on the chamber wall 11 opposite the extraction aperture 15, the disclosure is not limited to this embodiment. Rather, the outward protrusion 50 may be on any chamber wall 11.

The outward protrusion 50 and the recessed cavity 81 may be formed as complementary shapes, such that the outward protrusion 50 fits within the recessed cavity 81. In certain embodiments, the outward protrusion 50 and the recessed cavity 81 may have the same size and shape, such that the outward protrusion 50 fully occupies the recessed cavity 81. In other embodiments, the outward protrusion 50 may have the same shape as the recessed cavity 81, but may not extend to the same depth as the recessed cavity 81. For example, the outward protrusion 50 may be a cylinder having a diameter of 4" and a height of 2". The recessed cavity 81 may also be formed as a cylinder, but may terminate within the heat sink 80 at a depth of 2.5". Thus, in this embodiment, there is a small void (of roughly 0.5") in the back end of the recessed cavity 81, when the outward protrusion 50 in inserted in the recessed cavity 81. However, the outward protrusion 50 is shaped so that it contacts the sides of the recessed cavity 81 when expanded. Thus, the diameter of the recessed cavity 81 may be slightly greater than 4".

In certain embodiments, the outward protrusion 50 and the recessed cavity 81 of the heat sink 80 may be formed such that, at room temperature, there is a gap 82 between these components. This gap is referred to as the initial gap. The width of this gap 82 may vary, based on the intended application and temperature.

In one particular embodiment, the outward protrusion 50 may be a cylinder, having a height of between 0.5 and 1 inch and a diameter of about 4 inches. The recessed cavity may also be cylindrical, and may have a diameter slightly larger than that of the outward protrusion 50. In certain embodiments, the recessed cavity 81 has a depth that is roughly equal to the height of the outward protrusion 50, so that the outward protrusion 50 will contact the walls of the recessed cavity 81 along its sides and its bottom. In other embodiments, the recessed cavity 81 may have a depth greater than the height of the outward protrusion 50 and only the walls of the recessed cavity 81 may contact the outward protrusion 50 along its sides. In another embodiment, the outward protrusion 50 may be a tapered cylinder, such that the diameter of the outward protrusion 50 is greatest at the base where the outward protrusion 50 meets the chamber wall 11, and the diameter is smallest at the distal end. In this embodiment, the recessed cavity 81 may have a complementary shape, where the diameter of the recessed cavity is largest at the outer surface of the heat sink 80. Of course, as will be described in more detail below, the outward protrusion 50 and the recessed cavity 81 may have other shapes.

The heat sink 80 may be cooled by flowing a coolant fluid, in the form of a liquid or a gas, through channels 85 in the heat sink 80. In certain embodiments, the coolant fluid may be water, although other coolant fluids may also be used, depending on the desired temperature of the heat sink 80. The coolant fluid may be used to maintain the heat sink at any desired temperature. For example, if it is desirable to keep the heat sink 80 at a temperature greater than the boiling point of water, other fluids, such as ethylene glycol or propylene glycol may be used. If it is desirable to keep the heat sink 80 at a temperature lower than the freezing point of water, other fluids, such as ethyl alcohol, may be used. In other words, the heat sink 80 may be maintained at any desired temperature by circulating a suitable coolant fluid through the channels 85.

In certain embodiments, tension springs 90 (also see FIG. 1) may be used to pull the ion source 10 closer to the heat sink 80.

In operation, a gas is introduced to the ion source chamber 12 through a gas inlet 95. As explained above, the current passing through the filament 40 produces thermionic electrons which strike the cathode 30, which in turn emit electrons into the ion source chamber 12. These electrons serve to ionize the gas, creating plasma, containing ions, electrons and neutrals. The voltages applied to the cathode 30, filament 40 and repeller 35 may cause these components to heat considerably. This heat may then cause the chamber walls 11 to thermally expand. This heat likewise causes the outward protrusion 50 to expand, bringing the outward protrusion 50 into high pressure thermal contact with the walls of the recessed cavity 81 of the heat sink 80. High pressure thermal contact is defined as thermal contact that is achieved through thermal expansion of the outward protrusion 50 against the walls of the recessed cavity 81. This high pressure thermal contact may not be possible using convention means that draw the ion source 10 and the heat sink 80 near one another, such as tension springs.

In certain embodiments, the high pressure thermal contact may be caused by the compression of the expanded outward protrusion 50 against the walls of the recessed cavity 81. As the outward protrusion 50 is heated, it may expand beyond the dimensions of the recessed cavity 81, causing the outward protrusion 50 to be forced against the walls of the recessed cavity 81. This force, caused by thermal expansion, may be greater than can be generated using conventional means. Further, this force of compression may be roughly uniform between the outward protrusion 50 and the walls of the recessed cavity 81, creating a uniform pressure. This high pressure thermal contact improves the heat transfer coefficient between the outward protrusion 50 and the heat sink 80. This causes more heat to be extracted from the chamber walls 11 by the heat sink 80.

Without being bound to any particular theory, it is believed that, initially, there is a first heat transfer coefficient between the heat sink 80 and the ion source 10. This first heat transfer coefficient is based on the gap 82 between the recessed cavity 81 and the outward protrusion 50, and the temperature of the heat sink 80. As the ion source 10 begins operation, heat is extracted from the chamber walls 11 according to this first heat coefficient. In certain embodiments, more heat is generated by the ion source 10 than can be extracted by the heat sink 80, using this first heat coefficient. Consequently, the temperature of the ion source 10 begins to increase. This increase in the temperature of the ion source 10 causes thermal expansion of the chamber walls 11 and the outward protrusion 50. As the outward protrusion 50 expands, the gap 82 between the recessed cavity 81 of the heat sink 80 and the outward protrusion 50 decreases, which improves the heat transfer coefficient. It is believed, that as the gap decreases in thickness, there reaches a point where the heat sink 80 is able to extract an amount of heat sufficient to maintain the ion source 10 at a constant, or nearly constant, temperature. At this point, the temperature of the ion source 10 remains roughly constant, and the ion source 10 does not expand any further. Thus, the relationship between the outward protrusion 50 and the recessed cavity 81 reaches equilibrium.

The final temperature of the ion source 10 may be determined based on the gap 82 at room temperature, also referred to as the initial gap, and the temperature of the heat sink 80. For example, if there is a large initial gap, the outward protrusion 50 of the ion source 10 will expand to a greater extent before coming into high pressure thermal contact with the recessed cavity 81. To achieve this amount of expansion, a higher temperature of the ion source 10 is reached.

Similarly, the temperature of the heat sink 80 also helps determine the final temperature of the ion source 10. For example, the heat sink 80 may be made of a material with a high coefficient of thermal expansion (CTE), such as aluminum. As the temperature of the heat sink 80 is increased, the dimensions of the heat sink 80 likewise increase, creating a larger recessed cavity 81. Consequently, the ion source 10 will reach a higher temperature before the outward protrusion 50 is in high pressure thermal contact with the recessed cavity 81 of the heat sink 80. Additionally, since heat transfer is a function of the difference between the temperatures of the ion source 10 and the heat sink 80, there will be less heat transfer to a higher temperature heat sink. Finally, in certain embodiments, the CTE of the heat sink 80 is selected to be greater than that of the chamber walls 11 and the outward protrusion 50. For example, a 100° increase in the temperature of the heat sink 80 may cause a certain amount of thermal expansion. However, to achieve the same amount of thermal expansion, the temperature increase of the ion source 10 may be greater than 100°.

The temperature of the heat sink 80 may be determined in a variety of ways. In one embodiment, the temperature of the coolant fluid flowing through the channels 85 is varied to achieve the desired heat sink temperature. In another embodiment, the flow rate of the coolant fluid flowing through the channels 85 is altered to achieve the desired heat sink temperature. For example, a lower flow rate may necessitate a greater body temperature to transfer the requisite heat into the coolant fluid, resulting in a higher heat sink temperature, as compared to a higher flow rate. Thus, the temperature and/or the flow rate of the coolant fluid flowing through the channels 85 may be varied to achieve a desired heat sink temperature.

Thus, by properly selecting the initial gap and controlling the temperature of the heat sink 80, it is possible to regulate and control the temperature of the ion source 10.

Figure 3B:
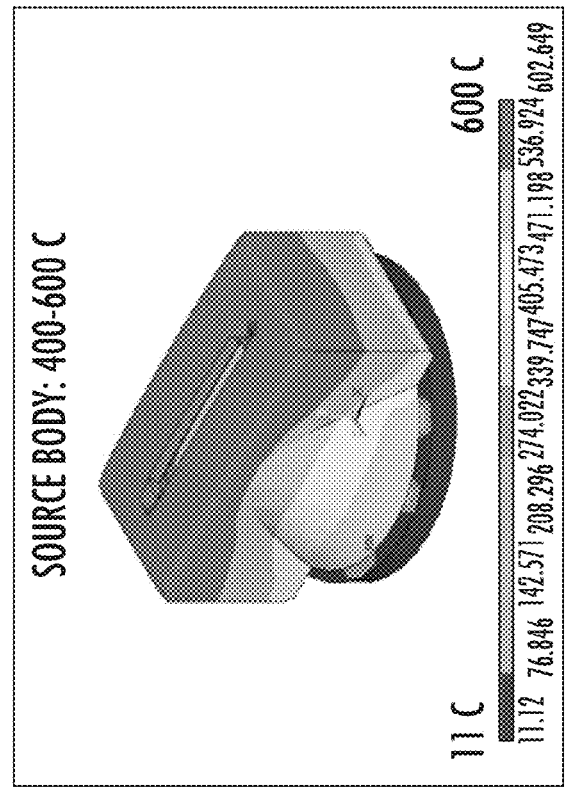
FIGS. 3A and 3B show a comparison of two different ion sources.
Figure 3A:
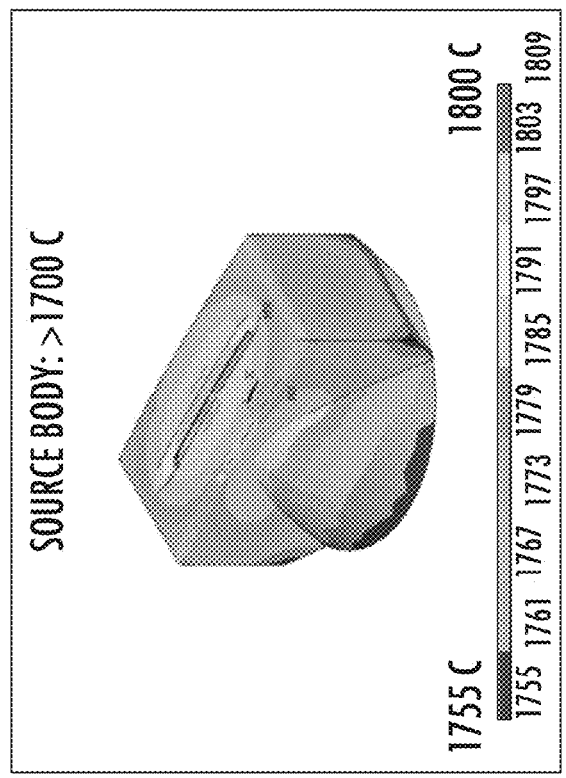

FIGS. 3A-3B show a comparison of the results achieved using the apparatus of FIG. 1, as compared to a traditional ion source. FIG. 3A shows a thermal image of a traditional ion source being operated at 3 kW and being used to extract an ion beam. In this embodiment, as can be seen, most parts of the ion source are at temperatures greater than 1770° C. The ion source of FIG. 3B comprises the outward protrusion 50 described above and is attached to a heat sink having a recessed cavity 81. The heat sink is maintained at a temperature close to 0° C. and the gap between the outward protrusion and the recessed cavity is roughly 3 mils. This ion source is operating at the same power level as the ion source of FIG. 3A. As seen in FIG. 3B, all parts of this ion source are below 600° C., a decrease of over 1000° C.!

Figure 4:
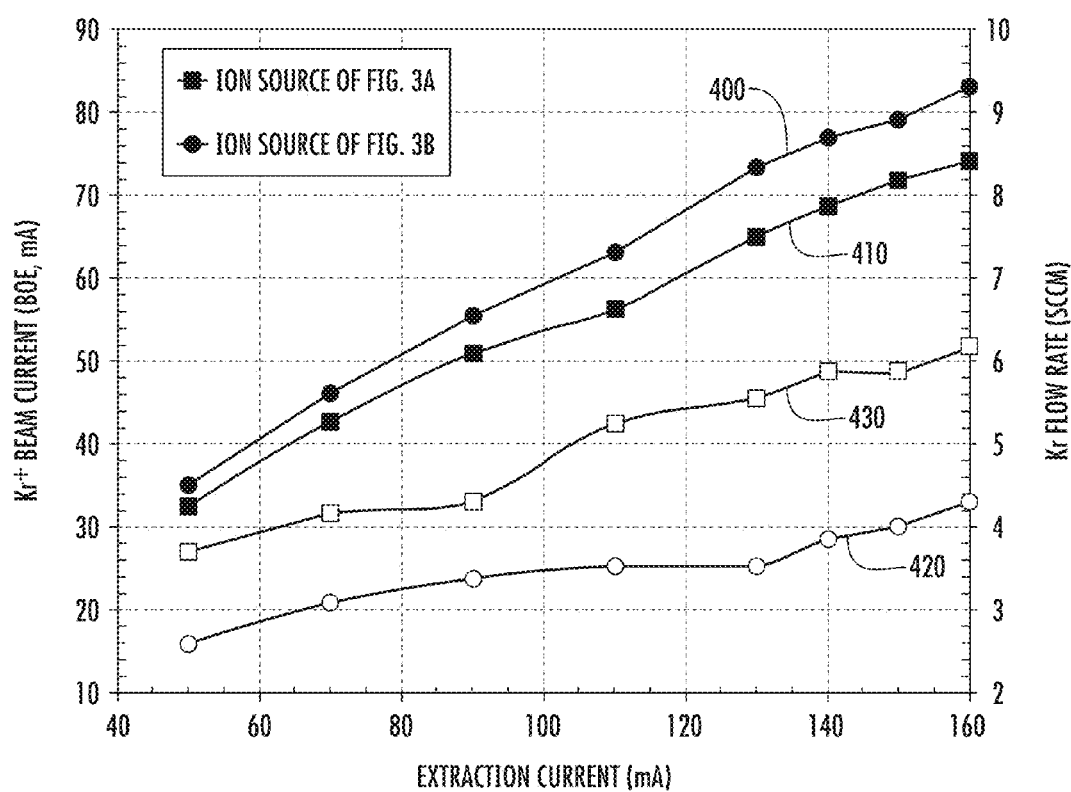
FIG. 4 illustrates a graph showing the effects of cooling the ion source.

In addition to cooling the ion source, it has been discovered that the performance of the ion source is improved through the use of the outward protrusion 50 shown in FIGS. 1 and 2. For example, FIG. 4 shows a graph comparing a traditional ion source (i.e. the ion source of FIG. 3A) with the apparatus described herein (i.e. the apparatus of FIG. 3B). In this test, krypton was used as the dopant gas, and an ion beam was extracted using an extraction voltage of 25 keV. Lines 400, 410 represent the ion beam current of $Kr^+$ ions using the ion source of FIG. 3B and FIG. 3A, respectively. As can be seen, at every extraction current, a larger $Kr^+$ beam current is achieved using the ion source of FIG. 3B. Thus, in this application, a cooler ion source is more efficient in extracting an $Kr^+$ ion beam. Lines 420, 430 represent the flow rate of krypton into the ion source chamber of FIG. 3B and FIG. 3A, respectively. Note that a much lower flow rate of dopant gas (i.e. krypton) is used by the ion source of FIG. 3B to produce the same extraction current. In summary, a cooler ion source has at least two performance benefits. First, the concentration of the dopant ions as a percentage of the extracted current increases. Second, the ionization efficiency, which is defined as the ratio of extracted dopant ion beam current to dopant gas flow rate, increases significantly. For example, assume an extraction current of 110 mA. The ion source of FIG. 3A uses a flow rate of krypton of about 5.4 SCCM to produce this output. Further, the Kr+ ion beam current is about 55 mA. In contrast, the cooled ion source of FIG. 3B uses a flow rate of krypton of only about 3.6 SCCM and produces an Kr+ ion beam current of about 64 mA.

Thus, in certain applications where high extraction current may be desirable, reducing the temperature of the ion source may improve the efficiency of ion beam generation. Using typical operating parameters, greater dopant beam current may be created while making more efficient use of the dopant gas.

Of course, each ion beam application may have a different optimal temperature. For example high current ion beams may have an optimal temperature that is different from lower current ion beams. Further, there may also be a temperature dependence based on the dopant used to create the ion beam. The present apparatus allows each ion beam application to be optimized by varying the initial gap, varying the temperature of the heat sink, or both.

Thus, prior to performing any manufacturing process, there may be a calibration process. During this calibration process, the temperature of the ion source may be varied, such as by changing the temperature of the coolant fluid flowing through the channels 85 of the heat sink 80 or by changing the flow rate of the coolant fluid flowing through the channels 85. At different temperatures, the ion beam current, the ionization efficiency and/or other parameters may be measured. After the calibration process is completed, an optimal temperature of the ion source for that particular ion beam application may be determined. Based on this optimal temperature, the initial gap and the temperature of the heat sink may be determined for that ion beam application.

In certain embodiments, a heat sink 80 and an ion source 10 with the outward protrusion 50 may be used for multiple ion beam applications. In this scenario, temperature optimization may be achieved by only varying the temperature of the coolant fluid passing through the channels 85 of the heat sink or by varying the flow rate of coolant fluid passing through the channels 85, each of which varies the temperature of the heat sink 80.

In other embodiments, one ion source may be used with a plurality of different heat sinks, each having a slightly different sized recessed cavity. In this embodiment, the temperature optimization may be achieved by varying the initial gap and/or the temperature of the heat sink.

As an example, a first ion beam application may be optimized with an ion source temperature of 600° C. and a second ion beam application may be optimized with an ion source temperature of 1000° C. In one embodiment, a single ion source and heat sink is used for both ion beam applications, where the temperature of the coolant fluid flowing through the channels 85 is higher for the second ion beam application. Alternatively, the flow rate of the coolant fluid may be lower in the second ion beam application. In another embodiment, there may be two different heat sinks with different sized recessed cavities. The heat sink with the smaller recessed cavity will have a smaller initial gap, and therefore may be used for the first ion beam application. In another embodiment, two different heat sinks having different size recessed cavities may be used and the temperature or flow rate of the coolant fluid flowing through the channels 85 may be different for the two heat sinks. In yet another embodiment, separate ion sources having differently sized outward protrusions may be used for the two ion beam applications. These two ion sources may be used with the same heat sink or with two different heat sinks. Further, the heat sinks may be maintained at the same or different temperatures.

Figure 5A:
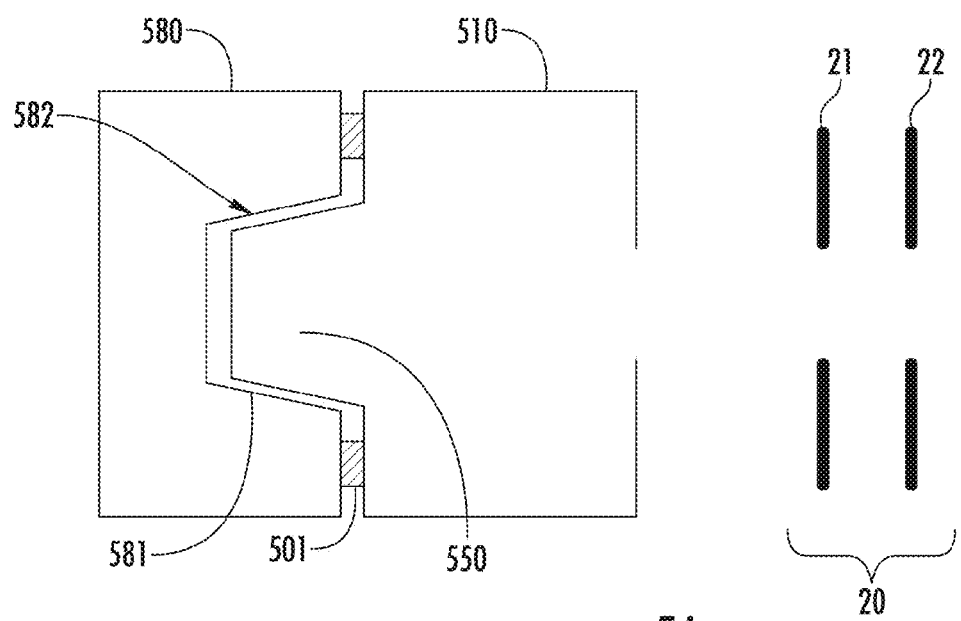
FIGS. 5A-5B show the use of shims with the apparatus according to one embodiment.
Figure 5B:
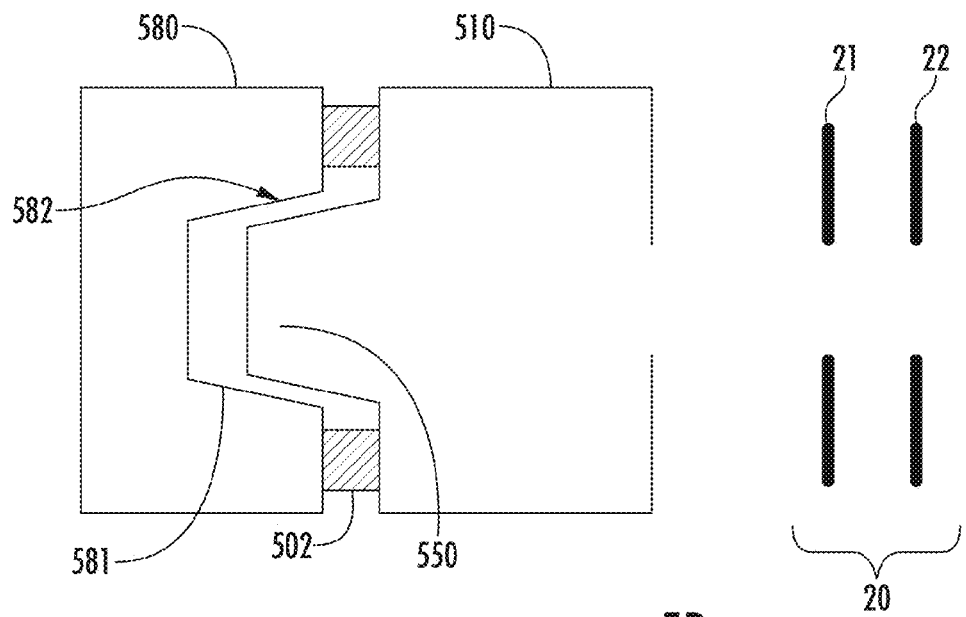

Further, in certain embodiments, shims may be used to adjust the gap. For example, FIGS. 5A-5B show an ion source 510 having an outward protrusion 550 which is formed as a tapered cylinder. The heat sink 580 has a similarly shaped recessed cavity 581. By varying the depth that the outward protrusion 550 is inserted into the recessed cavity 581, the gap 582 may be varied. FIG. 5A shows a first set of shims 501 used to provide a first spacing between the body of the ion source 510 and the body of the heat sink 580. Since the outward protrusion 550 and the recessed cavity 581 are both tapered, the use of shims creates both a spacing at the back of the recessed cavity 581 and a gap 582 between the sides of the outward protrusion 550 and the recessed cavity 581. As described above, the size of the initial gap may help determine the final temperature of the ion source 510. FIG. 5B shows the ion source 510 and heat sink 580 with a second set of shims 502 disposed therebetween. The second set of shims 502 is thicker than the first set of shims 501, and consequently, creates a larger gap 582 between the sides of the outward protrusion 550 and the sides of the recessed cavity 581. Thus, if the outward protrusion 550 and the recessed cavity 581 are tapered, shims may be used to vary the initial gap between these components. This provides another mechanism to regulate the temperature of the ion source.

Further, while FIGS. 5A-5B disclose the use of an outward protrusion 550 that is a tapered cylinder, and a complementary shaped recessed cavity 581, other embodiments are also possible. For example, any tapered shape may be used. For example, FIGS. 6B, 6D, 6F, 6H and 6I all describe other tapered shapes that may be used. Further, in certain embodiments, only one of the outward protrusion 550 and the recessed cavity 581 is tapered. For example, the outward protrusion 550 may be a tapered cylinder, while the recessed cavity 581 may not be tapered.

Thus, the use of an outward protrusion 550 that has a taper, coupled with differently sized shims, allows another parameter to be used to regulate the temperature of the ion source. For example, in certain embodiments, one set of components, which include an ion source 510 and a heat sink 580, are used to create a plurality of temperatures. For example, a plurality of sets of shims, where each set has a different thickness, may be used with the ion source 510 and the heat sink 580 to achieve different temperatures. Thus, in certain embodiments, the temperature of the heat sink 580 is held constant, while the temperature of the ion source 510 is modulated through the use of different sets of shims.

Further, in certain embodiments, a combination of these techniques may be used, based on the ion beam application. In other words, one or more of the following mechanisms may be used to regulate the temperature of the ion source:
  temperature of heat sink, which may be established by:
    varying the temperature of coolant fluid flowing through channels in the heat sink; or
    varying the flow rate of coolant fluid flowing through channels in the heat sink; and
  initial gap between outward protrusion and recessed cavity, which may be established by:
    varying the thickness of shims in cases where tapered outward protrusion is used; or
    varying the size of the recessed cavity by using multiple heat sinks; or
    varying the size of the outward protrusion by using multiple ion sources.

As noted above, the disclosure is not limited to a particular embodiment of the outward protrusion 50 and the recessed cavity 81. A plurality of different shapes may be used. FIGS. 6A-6I show a variety of different shapes that are suitable for the outward protrusion. Of course, this does not represent all possible shapes that are suitable, but is merely meant to illustrate a variety of possibilities.

FIG. 6A shows a top view and a side view of an outward protrusion 50 extending from the ion source 10 in the shape of a cylinder. FIG. 6B shows a top view and a side view of an outward protrusion 51 extending from the ion source 10 in the shape of a tapered cylinder. FIG. 6C shows a top view and a side view of an outward protrusion 52 extending from the ion source 10 in the shape of a rectangular prism. FIG. 6D shows a top view and a side view of an outward protrusion 53 extending from the ion source 10 in the shape of a tapered rectangular prism. In each of these embodiments, the recessed cavity 81 of the heat sink 80 is formed as a complementary shape, so that the outward protrusion fits within the recessed cavity 81. Further, in each of these embodiments, there is a single outward protrusion extending from the chamber wall.

However, other embodiments are also possible. For example, FIGS. 6E-6I each shows an ion source 10 having a plurality of outward protrusions. FIG. 6E shows a top view and a side view of a plurality of outward protrusions 54 extending from the ion source 10, each in the shape of a cylinder. FIG. 6F shows a top view and a side view of a plurality of outward protrusions 55 extending from the ion source 10, each in the shape of a tapered cylinder. FIG. 6G shows a top view and a side view of a plurality of outward protrusions 56 extending from the ion source 10, each in the shape of a rectangular prism. FIG. 6H shows a top view and a side view of a plurality of outward protrusions 57 extending from the ion source 10, each in the shape of a tapered rectangular prism. While all of the above embodiments describe an outward protrusion which is at least as wide at the base as it is at the distal end, other embodiments are also possible. For example, FIG. 6I shows a top view and a side view of a plurality of outward protrusions 58 extending from the ion source 10, each in the shape of an inverted tapered rectangular prism. In this embodiment, the ion source 10 may be slid in place on the heat sink 80.

While the disclosure describes the ion source as having an outward protrusion, other embodiments are also possible. For example, the ion source may be designed such that thermal expansion of the ion source causes high pressure thermal contact with the heat sink. In certain embodiments, a portion of the ion source is disposed in a recessed cavity in the heat sink, such that thermal expansion causes that portion to contact the sides of the recessed cavity.

The embodiments of this disclosure have many advantages. First, heat transfer between an ion source and a heat sink in a vacuum environment tends to be poor. By using the thermal expansion of the ion source, and more particularly the thermal expansion of the outward protrusion, to create high pressure thermal contact between the ion source and the heat sink, heat transfer is greatly improved. In fact, in one test, the temperature of the ion source was reduced over 1000° C.! Further, the present apparatus allows the temperature of the ion source to be adjusted using two different parameters; the temperature of the heat sink, and the initial gap between the outward protrusion and the recessed cavity. By having two tuning parameters, it is possible to achieve a wide range of ion source temperatures. Further, these tuning parameters allow optimization of each particular ion beam application simply and easily. Further, the amount of cooling achieved by this apparatus is greater than that possible using other methods. Finally, in some ion beam applications, such as high ion beam current applications, the beam current and ionization efficiency of the dopant species are improved by lowering the temperature of the ion source. This may reduce the consumption of the dopant species while increasing the concentration of implanted dopant.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for generating an ion beam, comprising:
  an ion source comprising a plurality of chamber walls, wherein an outward protrusion extends outward from one of the plurality of chamber walls, and
  a heat sink, having a recessed cavity, wherein the outward protrusion is disposed in the recessed cavity;
  wherein, at room temperature, there is an initial gap between the outward protrusion and the recessed cavity, such that the ion source and heat sink are not in contact, and wherein at a higher temperature of the ion source, there is high pressure thermal contact between the outward protrusion and the recessed cavity.

2. The apparatus of claim 1, wherein a final temperature of the ion source is determined based on a temperature of the heat sink and a width of the initial gap.

3. The apparatus of claim 2, wherein the heat sink comprises channels, and the temperature of the heat sink is determined based on a temperature of coolant fluid flowing through the channels.

4. The apparatus of claim 2, wherein the heat sink comprises channels, and the temperature of the heat sink is determined based on a flow rate of coolant fluid flowing through the channels.

5. The apparatus of claim 1, wherein the outward protrusion and the recessed cavity are complementary shapes.

6. The apparatus of claim 5, wherein the outward protrusion comprises a cylinder.

7. The apparatus of claim 5, wherein the outward protrusion comprises a tapered cylinder.

8. The apparatus of claim 1, wherein the ion source comprises an extraction aperture on a first chamber wall, and the outward protrusion is disposed on a second chamber wall opposite the first chamber wall.

9. An apparatus for generating an ion beam, comprising:
an ion source comprising a plurality of chamber walls and an extraction aperture, and
a heat sink;
wherein thermal expansion of the ion source causes high pressure thermal contact of the ion source with the heat sink, so as to regulate a temperature of the ion source and wherein a portion of the ion source extends into a recessed cavity in the heat sink, and thermal expansion causes the portion to contact sides of the recessed cavity.

10. The apparatus of claim 9, further comprising a second heat sink having a second recessed cavity, having a different dimension than the recessed cavity of the heat sink, wherein the ion source attains a different final temperature when used in conjunction with the second heat sink, for a given temperature of the heat sinks.

11. An apparatus for generating an ion beam, comprising:
an ion source comprising a plurality of chamber walls, wherein a tapered outward protrusion extends outward from one of the plurality of chamber walls, and
a heat sink, having a recessed cavity, wherein the tapered outward protrusion is disposed in the recessed cavity;
wherein, at room temperature, there is an initial gap between the tapered outward protrusion and the recessed cavity and
wherein a final temperature of the ion source is determined based on a temperature of the heat sink and a width of the initial gap.

12. The apparatus of claim 11, wherein the tapered outward protrusion and the recessed cavity are complementary shapes.

13. The apparatus of claim 11, wherein the heat sink comprises channels, and the temperature of the heat sink is determined based on a temperature of coolant fluid flowing through the channels.

14. The apparatus of claim 11, wherein the heat sink comprises channels, and the temperature of the heat sink is determined based on a flow rate of coolant fluid flowing through the channels.

15. The apparatus of claim 11, further comprising a set of shims disposed between the one of the plurality of chamber walls and the heat sink so as to set the initial gap between the tapered outward protrusion and the recessed cavity.

16. The apparatus of claim 15, wherein the final temperature of the heat sink is determined based on a thickness of the set of shims.

17. The apparatus of claim 11, wherein at the final temperature, there is high pressure thermal contact between the tapered outward protrusion and the heat sink.

* * * * *